US012772701B2

(12) United States Patent
Duan

(10) Patent No.: US 12,772,701 B2
(45) Date of Patent: Oct. 20, 2026

(54) DISPLAY MODULE AND MOBILE TERMINAL

(71) Applicant: Wuhan China Star Optoelectronics Semiconductor Display Technology Co., Ltd., Hubei (CN)

(72) Inventor: Yanqiang Duan, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 287 days.

(21) Appl. No.: 18/523,972

(22) Filed: Nov. 30, 2023

(65) Prior Publication Data

US 2024/0414981 A1 Dec. 12, 2024

(30) Foreign Application Priority Data

Jun. 7, 2023 (CN) ........................ 202310672496.6

(51) Int. Cl.

| | |
|---|---|
| ***G02F 1/1333*** | (2006.01) |
| ***H10K 59/126*** | (2023.01) |
| ***H10K 59/131*** | (2023.01) |
| ***H10K 59/80*** | (2023.01) |
| *H10K 102/00* | (2023.01) |

(52) U.S. Cl.

CPC ..... *H10K 59/873* (2023.02); *H10K 2102/311* (2023.02)

(58) Field of Classification Search

CPC .. H10K 59/873; H10K 59/126; H10K 59/131; H10K 59/87; H10K 59/8722; H10K 59/40; H10K 77/111; H10K 2102/311; H10K 2102/341; G09F 9/301; Y02E 10/549; Y02P 70/50; H05K 9/0054; G02F 1/1333; G06F 1/1652

See application file for complete search history.

(56) References Cited

U.S. PATENT DOCUMENTS

| | | | | |
|---|---|---|---|---|
| 2019/0140202 A1* | 5/2019 | Jin | ........................ | H10K 59/131 |
| 2020/0185641 A1* | 6/2020 | Jeong | ................. | H10K 59/8791 |
| 2021/0174710 A1* | 6/2021 | He | ........................ | G06F 1/1652 |
| 2021/0398955 A1* | 12/2021 | Liu | ...................... | H10D 86/411 |

(Continued)

FOREIGN PATENT DOCUMENTS

| | | |
|---|---|---|
| CN | 108922981 A | 11/2018 |
| CN | 112086493 A | 12/2020 |

(Continued)

OTHER PUBLICATIONS

Chinese Office Action issued in corresponding Chinese Patent Application No. 202310672496.6 dated Feb. 28, 2026, pp. 1-9.

*Primary Examiner* — Omar F Mojaddedi
(74) *Attorney, Agent, or Firm* — Nathan & Associates; Menachem Nathan

(57) ABSTRACT

Discloses are a display module and a mobile terminal. The display module includes a display panel, a cover plate, and a protective layer. The display panel includes a first body, a curved part, and a second body. The protective layer covers the curved part, a part of the first body, and a part of the second body. The protective layer is provided with a plurality of grooves. The plurality of grooves are arranged at intervals along a first direction and extend along a curve direction. The protective layer is of an arc shape in the second direction.

15 Claims, 9 Drawing Sheets

(56) References Cited

U.S. PATENT DOCUMENTS

2022/0009213 A1* 1/2022 Park ........................ H10K 59/87
2024/0341129 A1* 10/2024 Seo ....................... H10K 59/124

FOREIGN PATENT DOCUMENTS

| | | | |
|---|---|---|---|
| CN | 214541382 | U | 10/2021 |
| CN | 115842881 | A | 3/2023 |
| CN | 115985187 | A | 4/2023 |

* cited by examiner

DISPLAY MODULE AND MOBILE TERMINAL

CROSS-REFERENCE TO RELATED APPLICATIONS

This application claims priority to Chinese Patent Application No. 202310672496.6, filed on Jun. 7, 2023, the contents of which are incorporated herein by reference in its entirety.

FIELD OF INVENTION

The present disclosure relates to the field of display technologies, and in particular, to a display module and a mobile terminal.

BACKGROUND OF INVENTION

With a development trend in which an electronic device pursues an ultimate full screen, display screens (such as in mobile phones) on a market emerge in endlessly. To pursue appearance diversification of display devices, a cover plate of the display screen has been developed from a left-right two-side curved form to a four-side curved form or a full curved form.

In attaching of a curved surface of a full curved display screen, a greater surface curvature indicates stronger tensile stress on a curved part of the display screen, especially in curved regions on both sides of the screen. There are two bending forces perpendicular to each other along a bending axis in the regions to enable a curving radius of the curved regions close to the cover plate to be smaller. The abnormal curving may cause line rupture in a panel, resulting in abnormal display of the display screen.

SUMMARY OF INVENTION

The present disclosure provides a display module and a mobile terminal, which solve a problem of abnormal curving in curved parts of curved regions on both sides of a conventional full curved display module.

To resolve the foregoing problem, the present disclosure provides the following technical solutions.

The present disclosure provides a display module. The display module includes: a display panel including a first body, a second body, and a curved part disposed between the first body and the second body, wherein the second body is disposed on a side facing away from a light-exiting surface of the display panel; a cover plate disposed on the display panel, wherein the cover plate includes a first bent part corresponding to the curved part, the first bent part includes a first bent section and second bent sections located on both sides of the first bent section, a minimum value of bending curvature of the first bent section is less than or equal to a maximum value of bending curvature of the second bent sections, and the bending curvature of the second bent sections is greater than 0; and a protective layer disposed on a surface of the display panel, wherein the protective layer covers the curved part, a part of the first body, and a part of the second body, wherein the protective layer is provided with a plurality of grooves, the plurality of grooves are arranged at intervals along a first direction and extend along a second direction, the first direction is parallel to a direction from the first bent section to the second bent sections, and the second direction is parallel to a curve direction from the first body to the second body.

In the display module according to the present disclosure, the plurality of grooves are located in a region of the protective layer corresponding to the first bent section.

Extending lengths of the grooves in the second direction are equal to a length of the protective layer in the second direction.

In the display module according to the present disclosure, the plurality of grooves are located in regions of the protective layer corresponding to the second bent sections.

Alternatively, the plurality of grooves are located in regions of the protective layer corresponding to the first bent section and the second bent sections.

In the display module according to the present disclosure, depths of the grooves close to the first bent section are less than depths of the grooves away from the first bent section.

In the display module according to the present disclosure, depths of the plurality of grooves gradually decrease in a direction from the second bent sections to the first bent section.

In the display module according to the present disclosure, a depth of a side of each groove close to the first body is greater than a depth of a side of each groove away from the first body.

In the display module according to the present disclosure, depths of the plurality of grooves are same. A spacing between two adjacent grooves corresponding to the first bent section is greater than a spacing between two adjacent grooves corresponding to the second bent sections.

In the display module according to the present disclosure, a spacing between two adjacent grooves gradually increases in a direction from the second bent sections to the first bent section.

In the display module according to the present disclosure, the protective layer includes a first protective part, a curved protective part, and a second protective part that are continuously arranged. The first protective part covers the part of the first body. The second protective part covers the part of the second body. The curved protective part covers the curved part.

An orthographic projection of the plurality of grooves on the protective layer overlaps at least a part of the first protective part and the curved protective part.

In the display module according to the present disclosure, a spacing between an end of each groove close to the first body and an end of the protective layer close to the first body in the second direction is a first spacing. A spacing between an end of each groove close to the second body and an end of the protective layer close to the second body in the second direction is a second spacing. The first spacing is less than the second spacing.

In the display module according to the present disclosure, in the plurality of grooves corresponding to the second bent sections, the second spacing of the grooves close to the first bent section is less than the second spacing of the grooves away from the first bent section.

In the display module according to the present disclosure, depths of the grooves are less than a thickness of the protective layer.

A cross section of each groove is V-shaped. An acute angle between a surface of each groove and the light-exiting surface of the display module ranges from 35° to 75°.

In the display module according to the present disclosure, bending curvature of the cover plate gradually decreases in the direction from the first bent section to the second bent sections.

Alternatively, the cover plate includes a first section and a second section that are arranged continuously in the direction from the first bent section to the second bent sections, bending curvature of the first section is a constant value, and bending curvature of the second section gradually decreases.

The present disclosure further provides a mobile terminal, wherein the mobile terminal includes a terminal body and the foregoing display module, and the terminal body and the display module are integrated. The display module includes: a display panel including a first body, a second body, and a curved part disposed between the first body and the second body, wherein the second body is disposed on a side facing away from a light-exiting surface of the display panel; a cover plate disposed on the display panel, wherein the cover plate includes a first bent part corresponding to the curved part, the first bent part includes a first bent section and second bent sections located on both sides of the first bent section, a minimum value of bending curvature of the first bent section is less than or equal to a maximum value of bending curvature of the second bent sections, and the bending curvature of the second bent sections is greater than 0; and a protective layer disposed on a surface of the display panel, wherein the protective layer covers the curved part, a part of the first body, and a part of the second body, wherein the protective layer is provided with a plurality of grooves, the plurality of grooves are arranged at intervals along a first direction, the plurality of grooves extend along a second direction, the first direction is parallel to a direction from the first bent section to the second bent sections, and the second direction is parallel to a curve direction from the first body to the second body.

In the mobile terminal according to the present disclosure, the plurality of grooves are located in a region of the protective layer corresponding to the first bent section, and extending lengths of the grooves in the second direction are equal to a length of the protective layer in the second direction.

In the mobile terminal according to the present disclosure, the plurality of grooves are located in regions of the protective layer corresponding to the second bent sections.

In the mobile terminal according to the present disclosure, the plurality of grooves are located in regions of the protective layer corresponding to the first bent section and the second bent sections.

BRIEF DESCRIPTION OF DRAWINGS

The following describes specific implementations of the present disclosure in detail with reference to the accompanying drawings, to make the technical solutions and other beneficial effects of the present disclosure clear.

DETAILED DESCRIPTION OF PREFERRED EMBODIMENTS

The following clearly and fully describes the technical solutions in embodiments of the present disclosure with reference to the accompanying drawings in embodiments of the present disclosure. Apparently, the described embodiments are merely some but not all of the embodiments of the present disclosure. All other embodiments obtained by a person skilled in the art based on the embodiments of the present disclosure without creative efforts shall fall within the scope of the present disclosure.

Figure 1:
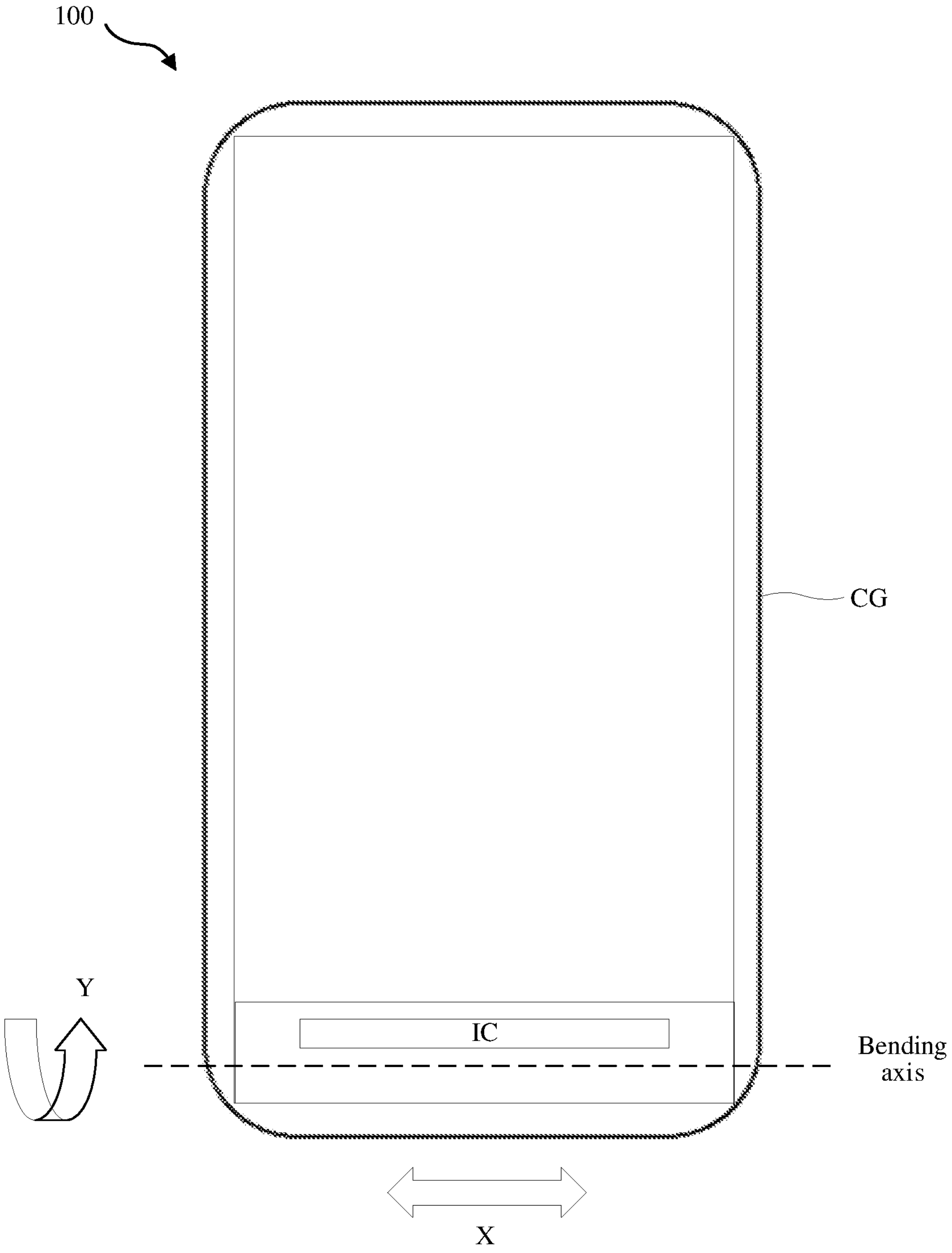
FIG. 1 is a top view of a curved surface of a conventional full curved display screen attaching a side facing away from a light-exiting surface.
Figure 2:
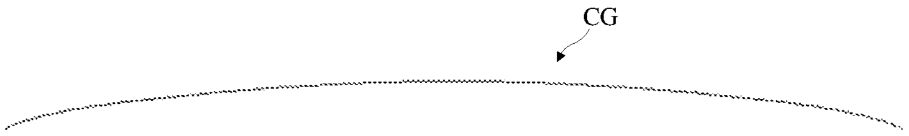
FIG. 2 is a diagram of a structure of a cover plate of a conventional full curved display screen.
Figure 3:
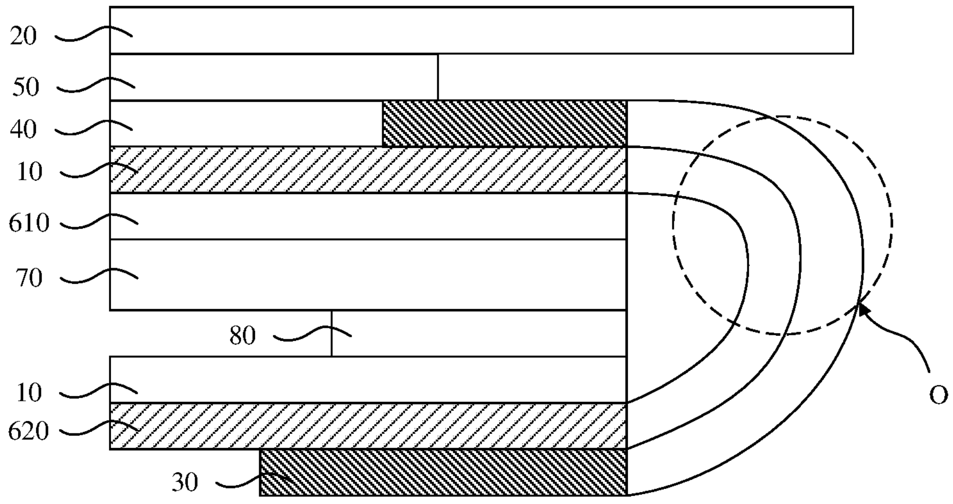
FIG. 3 is a sectional view of a curved part in a conventional full curved display screen.

FIG. 1 is a top view of a curved surface of a full curved display screen attaching a side facing away from a light-exiting surface. FIG. 2 shows a full curved cover plate CG. To be specific, the cover plate is in a curved state at any position, and greater surface curvature indicates stronger tensile stress on a curved display panel 10, especially in curved regions on both sides of the display panel 10. Two bending forces perpendicular to each other along a bending axis exist in the regions, that is, bending forces along two directions, an X direction and a Y direction, to enable a curving radius of the curved regions close to the cover plate to be shorter. For example, in the structure shown in FIG. 3, the abnormal curving causes the display panel 10 in a region O to tilt towards a cover plate 20 and may cause line rupture in the display panel 10, resulting in abnormal display of the display panel 10.

Referring to FIGS. 4 to 20, the present disclosure provides a display module 100. The display module may include a display panel 10, a cover plate 20 disposed on the display panel 10, and a protective layer 30 disposed on a surface of the display panel 10.

In the present embodiment, the display panel 10 may be a flexible display panel. The display panel 10 may include a first body 110, a second body 120, and a curved part 130 disposed between the first body 110 and second body 120.

The second body 120 is disposed on a side facing away from a light-exiting surface of the display panel 10.

In the present embodiment, the cover plate 20 includes a first bent part 210 corresponding to the curved part 130. The first bent part 210 includes a first bent section 211 and second bent sections 212 located on both sides of the first bent section 211. A minimum value of bending curvature of the first bent section 211 is less than or equal to a maximum value of bending curvature of the second bent sections 212. The bending curvature of the second bent sections 212 is greater than 0.

In the present embodiment, the protective layer 30 covers the curved part 130, a part of the first body 110, and a part of the second body 120.

In the present embodiment, the protective layer 30 is provided with a plurality of grooves 340. The plurality of grooves 340 are arranged at intervals along a first direction X. The plurality of grooves 340 extend along a second direction Y. The first direction X is parallel to a direction from the first bent section 211 to the second bent sections 212. The second direction Y is parallel to a curve direction from the first body 110 to the second body 120.

Figure 4:
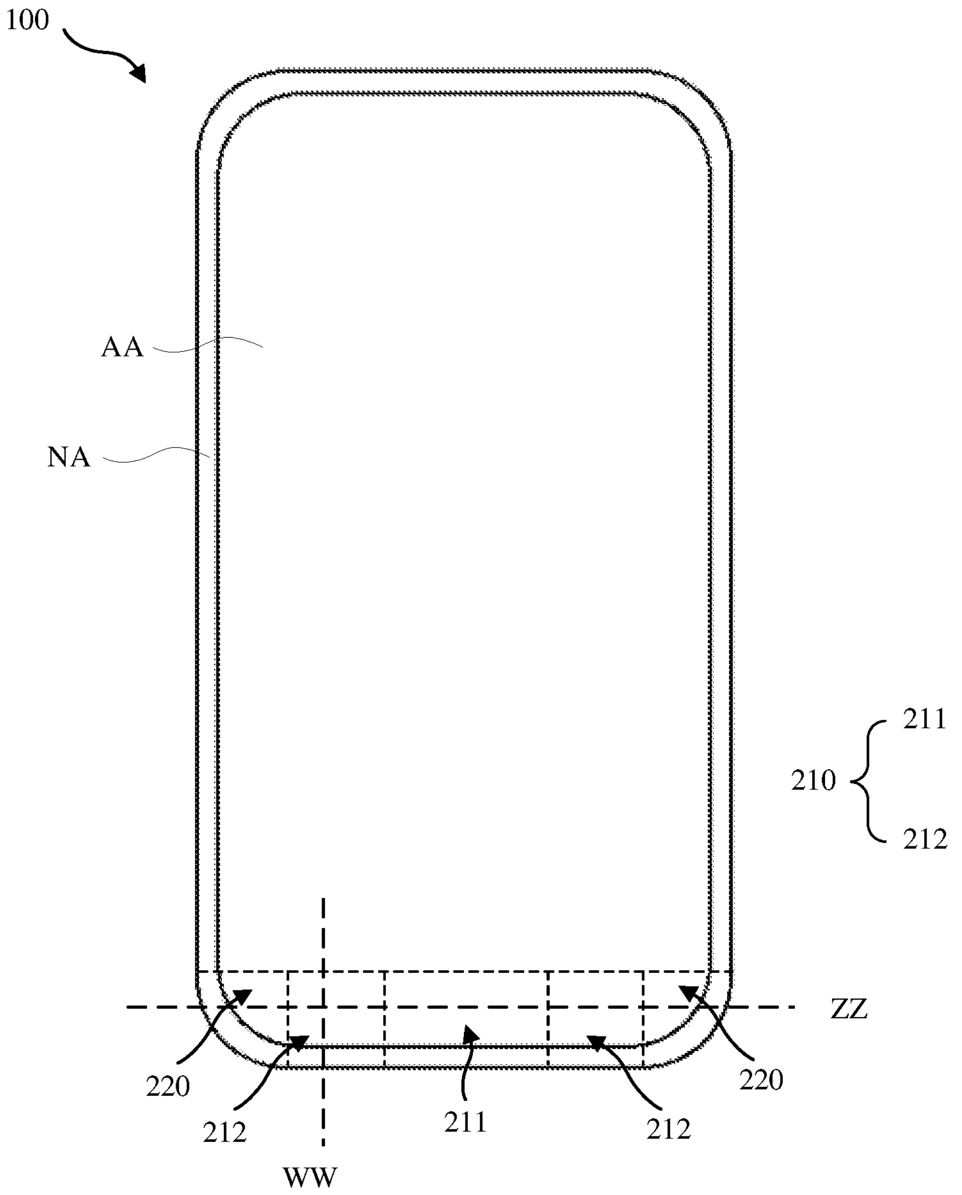
FIG. 4 is a simplified top view of a structure of a display module according to the present disclosure.

It is to be noted that, in a structure shown in FIG. 4, the cover plate 20 includes two second bent parts 220 located on both sides of the first bent part 210. The second bent parts 220 do not correspond to the curved part 130. In other words, the curved part 130 of the display panel 10 and the second bent parts 220 are arranged in a non-overlapping manner in a direction of a top view of the display panel 10. The second bent parts 220 and the second bent sections 212 are arranged continuously, and a minimum value of bending curvature of the second bent parts 220 is greater than the maximum value of bending curvature of the second bent sections 212. Because the curved part 130 and the second bent parts 220 are arranged in a non-overlapping manner, in the present disclosure, curving of the second bent parts 220 does not exert a force in a corresponding direction on the curved part 130. Abnormal curving of the curved part 130 is mainly caused by a change of the bending curvature of the second bent sections 212.

Figure 5:
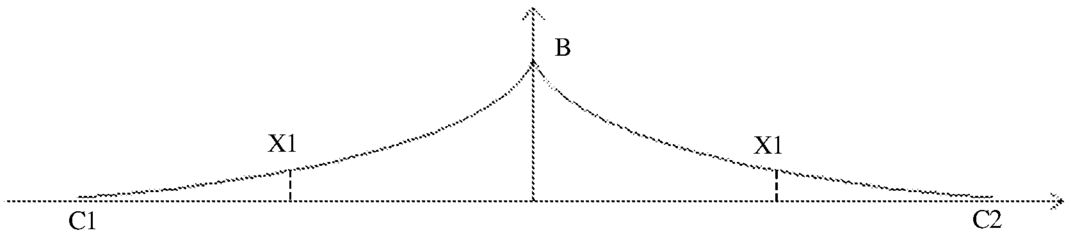
FIG. 5 is a distribution diagram of curvature of a first type of a cover plate of a cross section ZZ in FIG. 4.
Figure 6:
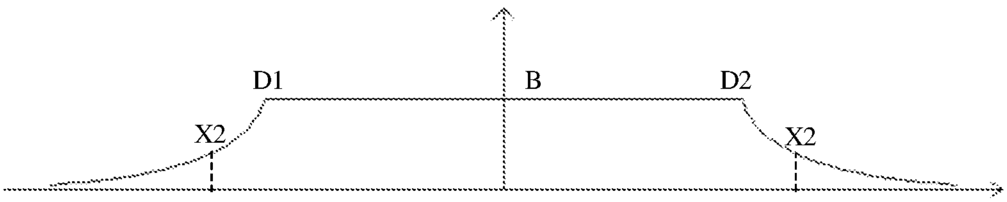
FIG. 6 is a distribution diagram of curvature of a second type of a cover plate of a cross section ZZ in FIG. 4.

It is to be noted that, change patterns of a curvature radius of the cover plate 20 along a cross section ZZ in FIG. 4 may be shown in FIG. 5 and FIG. 6. A reciprocal of the curvature radius is bending curvature. The following is described in terms of the curvature radius. In a structure shown in FIG. 5, the curvature radius of the cover plate 20 is the largest at a point B, that is, an axis of the cover plate 20. The curvature radius gradually decreases in a direction from the point B to points C1 and C2 of the cover plate 20. In a structure shown in FIG. 6, the curvature radius of the cover plate 20 is a constant value in a direction from the point B to points D1 and D2 which are on both sides of the point B, and inflection points occur in the curvature radius at the points D1 and D2, respectively, after which the curvature radius gradually decreases. In change diagrams of curvature radius shown in FIG. 5 and FIG. 6, when the curvature radius reduces to a value, such as at X1*s* in FIG. 5 and at X2*s* in FIG. 6, bending forces at these points from the first direction X and the second direction Y cause the curved part 130 of the display panel 10 to shift toward the cover plate 20, resulting in abnormal curving. In addition, as the curvature radius further decreases, shift of the curved part 130 toward the cover plate 20 is more serious. Therefore, the curvature radius of the cover plate is negatively correlated with the bending forces exerted by the cover plate on the curved part. Greater bending curvature of the cover plate indicates more serious abnormal curving of the display panel.

Figure 7:
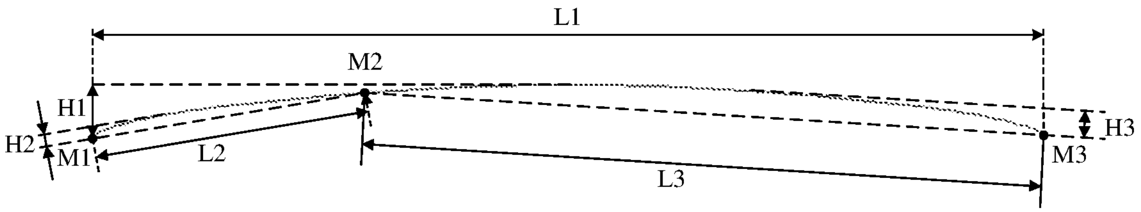
FIG. 7 shows a protective layer of a display module according to the present disclosure.

In the present embodiment, referring to FIG. 7, an arc M1M3 is a schematic diagram of the protective layer 30 in the cross-section ZZ. Due to the change of the curvature radius of the cover plate 20, the protective layer 30 is arcuate in the first direction X, and an arc length and an arc height of the arc M1M3 are L1 and H1, respectively. When a groove 340 is provided at a point M2, the arc M1M3 is divided into a first protective section M1M2 and a second protective section M2M3. Under the action of the cover plate, the first protective section M1M2 and the second protective section M2M3 are curved independently. An arc length and an arc height of the first protective section M1M2 are L2 and H2, respectively. An arc length and an arc height of the second protective section M2M3 are L3 and H3, respectively. H2 and H3 are both less than H1. Curving resistance strength of a single protective section is decreased with decrease of an arc height, to enable the single protective section to curve more easily, thereby facilitating rounding of an arc angle of the curved part 130.

In the present embodiment, when the point M2 is a midpoint of M1 and M3, L2 is equal to L3, H2 is equal to H3, and curving resistance strength of the first protective section M1M2 is equal to that of the second protective section M2M3.

In the present disclosure, the protective layer 30 is provided with the plurality of grooves 340 extending along the curve direction to divide the protective layer 30 into at least two sections, so that an arc length and an arc height of a single protective section are reduced, to enable the single protective section to curve more easily, thereby facilitating rounding of an arc angle of the curved part 130, mitigating an abnormal shape of a side of the curved part 130 close to the cover plate 20, improving force uniformity of the curved part 130, and reducing a risk of line rupture in the display panel 10.

Technical solutions of the present disclosure are described with reference to specific embodiments.

Referring to FIG. 4, the display module 100 includes a display region AA and a non-display region NA arranged adjacent to the display region AA. Optionally, the non-display region NA surrounds the display region AA, so that the display region AA is surrounded by the non-display region NA. The display region AA is a region of the display module 100 that is configured to perform a display function. A plurality of display units are disposed in the display region AA and are configured to perform the display function of the display region AA. The non-display region NA may be a frame region of the display module 100. A functional component that assists the plurality of display units in the display region AA with displaying may be disposed in the non-display region NA.

Figure 8:
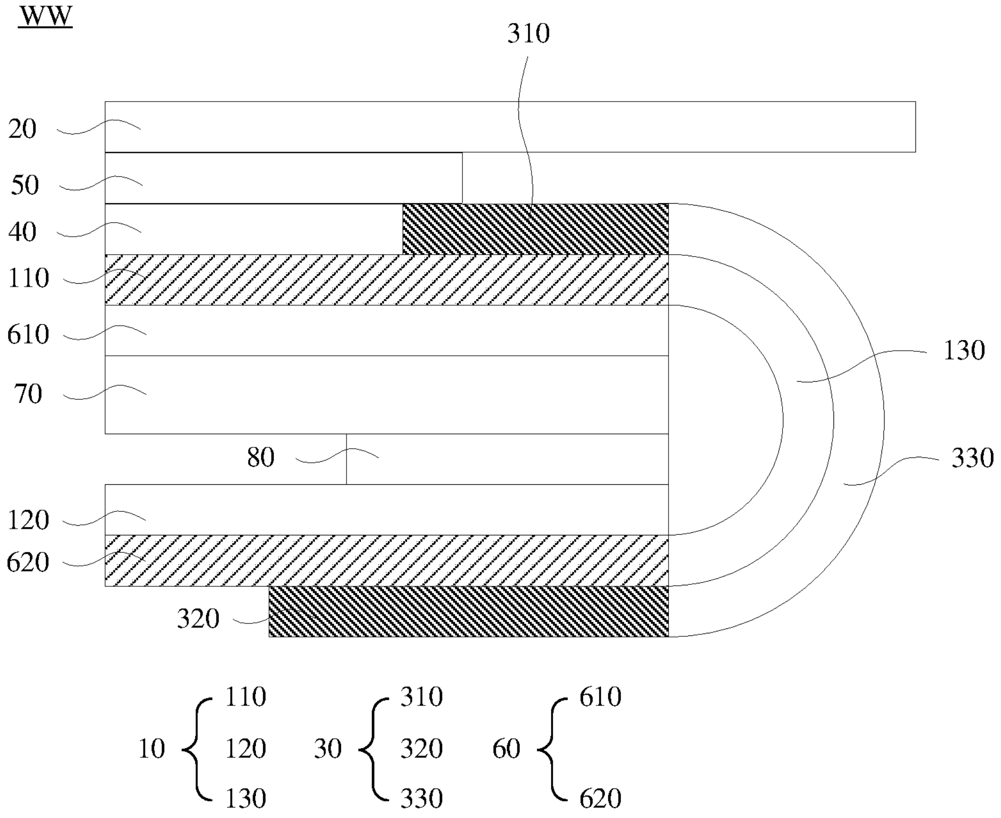
FIG. 8 is a sectional view of a cross section WW in FIG. 4.

In the present embodiment, referring to FIG. 8, it is a sectional view of the cross section WW in FIG. 4. The cross section WW may be any cross section of a lower frame region of the display module 100. The display module 100 may include the display panel 10, a polarizer 40 disposed on the display panel 10, an optical adhesive layer 50 disposed on the polarizer 40, and the cover plate 20 disposed on the optical adhesive layer 50.

Figure 9:
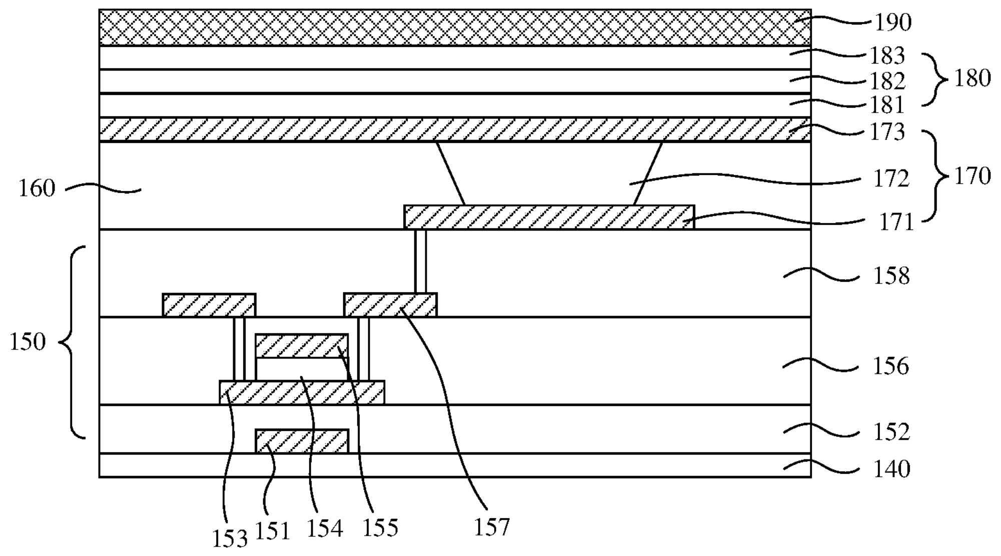
FIG. 9 is a diagram of a film structure of a display module according to the present disclosure.

In the present embodiment, referring to FIG. 9, the display panel 10 may include a base substrate 140, a drive circuit layer 150 disposed on the base substrate 140, a pixel definition layer 160 and a light-emitting element layer 170 disposed on the drive circuit layer 150, a package layer 180 disposed on the pixel definition layer 160, and a touch layer 190 disposed on the package layer 180.

In the present embodiment, the base substrate 140 supports each layer disposed on the base substrate 140. When the display panel 10 is a bottom-emitting light display apparatus or a double-side-emitting light display apparatus, a transparent base substrate may be used. When the display panel 10 is a top-emitting light display apparatus, a semi-transparent or non-transparent base substrate and transparent base substrate may be used.

In the present embodiment, the base substrate 140 is made of an insulating material, such as glass, quartz, or a polymer resin. The base substrate 140 may be a rigid substrate or a flexible substrate that can be curved, folded, crimped, and the like. Examples of a flexible material of the flexible substrate include, but are not limited to, polyimide (PI).

In the present embodiment, referring to FIG. 9, the drive circuit layer 150 may include a plurality of thin film transistors. Each thin film transistor may be an etch stop type, or a back channel etch type, or may be divided into structures, such as a bottom-gate thin film transistor and a top-gate thin film transistor, based on a position of a gate and a position of an active layer. This is not limited specifically. For example, the thin film transistor shown in FIG. 9 is a top-gate thin film transistor. The thin film transistor may include a light shielding layer 151 disposed on the substrate, a buffer layer 152 disposed on the light shielding layer 151, an active layer 153 disposed on the buffer layer 152, a gate insulating layer 154 disposed on the active layer 153, a gate layer 155 disposed on the gate insulating layer 154, an interlayer insulating layer 156 disposed on the gate layer 155, source/drain layers 157 disposed on the interlayer insulating layer 156, and a planarization layer 158 disposed on the source/drain layers 157. In the present embodiment, the interlayer insulating layer 156 may be laid in whole or may be formed in a same photomask process as the gate layer 155, such as a structure shown in FIG. 9. The structure of the thin film transistor in FIG. 9 is only an example of the present disclosure, and other types of thin film transistors are applicable to the present disclosure.

In the present embodiment, referring to FIG. 9, the light-emitting element layer 170 may further include an anode layer 171 disposed on the planarization layer 158, a light-emitting layer 172 disposed on the anode layer 171, and a cathode layer 173 disposed on the light-emitting layer 172. The anode layer 171 includes a plurality of anodes. The pixel definition layer 160 includes a plurality of pixel openings that are in one-to-one correspondence with the plurality of anodes, and each pixel opening correspondingly exposes an upper surface of an anode. The light-emitting layer may include a plurality of light-emitting pixels that are in one-to-one correspondence with the plurality of anodes.

In the present embodiment, referring to FIG. 9, the package layer 180 covers the pixel definition layer 160 and continuously covers the plurality of pixel openings and the plurality of light-emitting pixels. The package layer 180 may include at least a first inorganic package layer 181, a first organic package layer 182, and a second inorganic package layer 183 that are stacked on the pixel definition layer 160.

In the present embodiment, referring to FIG. 9, the touch layer 190 may include a first touch metal layer and a second touch metal layer that are disposed on the package layer 180, and an insulating layer disposed between the first touch metal layer and the second touch metal layer. The touch layer 190 provided in embodiments of the present disclosure may be a mutual capacitance type or a self-capacitance type. A specific type and structure of the touch layer 190 may be selected based on an actual requirement.

In the present embodiment, the polarizer 40 may be disposed on an upper side of the touch layer 190. This is not limited specifically.

In the present embodiment, referring to FIG. 8, the display module 100 also includes a backplane layer 60. The backplane layer 60 includes a first backplane 610 and a second backplane 620 that are separated. The first backplane 610 is located on a side of the first body 110 facing away from a light-exiting surface, and the first backplane 610 is bonded to the first body 110 by an adhesive layer. The second backplane 620 is located on a side of the second body 120 close to the light-exiting surface, and the second backplane 620 is bonded to the second body 120 by an adhesive layer. In other words, the first backplane 610 and the second backplane 620 are located between the first body 110 and the second body 120.

In the present embodiment, referring to FIG. 8, the display module 100 also includes a first support layer 70 and a second support layer 80 that are disposed between the first backplane 610 and the second backplane 620. The first support layer 70 is bonded to the first backplane 610 by an adhesive layer. The second support layer 80 is bonded to the second backplane 620 by an adhesive layer. A material of the first support layer 70 may be stainless steel. A material of the second support layer 80 may be foam, polyethylene terephthalate (PET), or the like.

In the present embodiment, referring to FIG. 8, the display module 100 may also include a protective layer 30 disposed on the display panel 10. The protective layer 30 includes a first protective part 310, a second protective part 330, and a curved protective part 320 that are continuously arranged. The first protective part 310 covers a part of the first body 110. The second protective part 330 covers a part of the second body 120. The curved protective part 320 covers the curved part 130.

Figure 10:
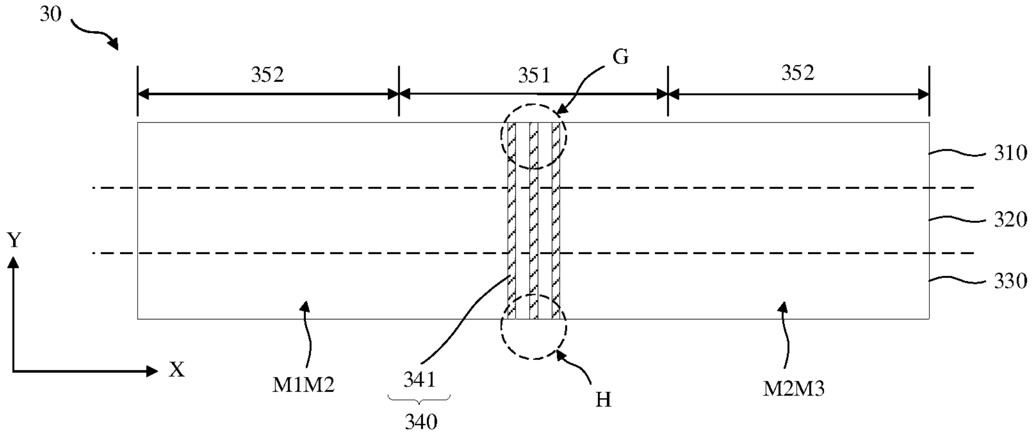
FIG. 10 is a first expansion diagram of a protective layer in a display module according to the present disclosure.

Referring to FIG. 10, the plurality of grooves 340 may include first grooves 341. The first grooves 341 may be located in a region corresponding to the first bent section 211 in the protective layer 30. An extending length of the first grooves 341 in the second direction Y is equal to a length of the protective layer 30 in the second direction Y.

In a structure shown in FIG. 10, the protective layer 30 may include a first protective region 351 and second protective regions 352 located on both sides of the first protective region 351. The first protective region 351 corresponds to the first bent section 211. The second protective regions 352 correspond to the second bent sections 212.

In the present embodiment, because the first bent section 211 is located in a center region of the display panel 10, the first grooves 341 may be provided in the first protective region 351 of the protective layer 30. In addition, because abnormal curving of the curved part 130 is mainly present in the second protective regions 352, the first grooves 341 provided in the first protective region 351 may divide the protective layer 30 into the first protective section M1M2 and the second protective section M2M3, thereby reducing the arc height of the single protective layer section, and eliminating the abnormal curving. However, if the extending length of the first grooves 341 in the second direction Y is less than the length of the protective layer 30 in the second direction Y, bending forces of the first protective section M1M2 and the second section M2M3 may be transferred therebetween through protective materials of a region G and a region H in FIG. 10, so that abnormal curving may occur in the curved part 130 at a position corresponding to the second bent sections 212.

In the present embodiment, the extending length of the first grooves 341 in the second direction Y is equal to the length of the protective layer 30 in the second direction Y. To be specific, the protective materials of the region G and the region H are removed, so that the first protective section M1M2 and the second protective section M2M3 are curved separately, to further avoid the abnormal curving possibly occurring in the curved part 130 at a position corresponding to the second bent sections 212, thereby facilitating rounding of an arc angle of the curved part 130.

In another embodiment of the present disclosure, when the first protective section M1M2 and the second protective section M2M3 are separated from each other, that is, depths of the first grooves 341 are equal to a thickness of the protective layer 30, the first protective section M1M2 is completely isolated from the second protective section M2M3 by the first grooves 341. Therefore, there is no force transfer between the first protective section M1M2 and the second protective section M2M3, and an optimal mitigating effect of the abnormal curving may be achieved. However, the protective layer 30 is configured to mainly protect metal lines on the curved part 130, so as to isolate the metal lines from water and oxygen, and if the depths of the first grooves 341 are equal to the thickness of the protective layer 30, metal lines in a region in which the first grooves 341 are located are exposed, so that a risk that the metal lines are eroded by water and oxygen occurs. Therefore, the depths of the first grooves 341 in the present disclosure need to be less than the thickness of the protective layer 30, to avoid a technical problem of a failure of the metal line in a lower layer.

In the present embodiment, when the first protective section M1M2 is completely isolated from the second protective section M2M3 by the first grooves 341, another adhesive material may be filled between the first protective section M1M2 and the second protective section M2M3. In this way, there is no force transfer between the first protective section M1M2 and the second protective section M2M3, and the exposed metal lines may also be protected.

In the present embodiment, there may be a plurality of first grooves 341 located in the first protective region 351. The plurality of first grooves 341 may be arranged at intervals.

Figure 11:
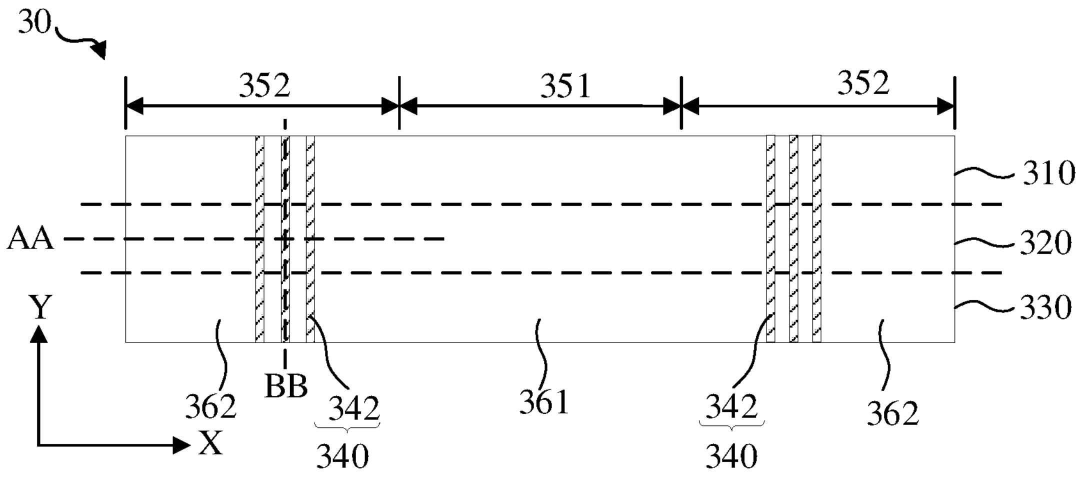
FIG. 11 is a second expansion diagram of a protective layer in a display module according to the present disclosure.

Referring to FIG. 11, the plurality of grooves 340 may include second grooves 342. The second grooves 342 may be located in regions corresponding to the second bent sections 212 in the protective layer 30. Because abnormal curving of the curved part 130 mainly occurs in the regions corresponding to the second bent sections 212, the plurality of second grooves 342 may be located in the second protective regions 352 of the protective layer 30. Therefore, in the present disclosure, the second protective regions 352 may be provided with the second grooves 342, to mitigate a technical problem of abnormal curving occurring in the display panel 10.

In the present embodiment, the two second protective regions 352 may be provided with a plurality of second grooves 342, so that the protective layer 30 is divided into a middle protective section 361 having a greater length and edge protective sections 362 having shorter lengths. Compared with a protective layer 30 without the second grooves 342, arc lengths and arc heights of the middle protective section 361 and the edge protective sections 362 are both reduced. The decrease of the arc lengths and the arc heights causes the curving resistance strength of a single section of the protective layer 30 to be decreased, to enable the single section of the protective layer 30 to curve more easily, thereby facilitating rounding of an arc angle of the curved part 130. In addition, although the length of the middle protective section 361 is greater, bending curvature of the cover plate 20 corresponding to the middle protective section 361 changes little, and bending forces applied by the cover plate 20 on the middle protective section 361 is small, so that the abnormal curving is avoided. Furthermore, bending curvature of the cover plate 20 corresponding to the edge protective sections 362 changes greatly, and bending forces applied by the cover plate 20 on the edge protective sections 362 is large. Because arc lengths and arc heights of the edge protective sections 362 are small, the edge protective sections 362 are capable of curving more easily, avoiding the abnormal curving. In addition, because the abnormal curving of the display panel 10 mainly occurs in the regions corresponding to the second bent sections 212, and bending curvature of the cover plate 20 in these regions is large, the curved part 130 is subjected to large bending forces from two directions. Arrangement of the second grooves 342 may eliminate the concentration of the bending forces in the regions, so that the protective layer 30 in the regions is enabled to curve more easily.

In the present embodiment, because the abnormal curving of the curved part 130 is mainly in the regions corresponding to the second bent sections 212, and arrangement of the second grooves 342 may remove part materials of the protective layer 30 in the regions, bending stiffness of the regions is reduced, so that the regions in which the second grooves 342 are located are enabled to curve more easily.

In the present embodiment, there may be a plurality of second grooves 342. The plurality of second grooves 342 may be arranged at intervals.

Figure 12:
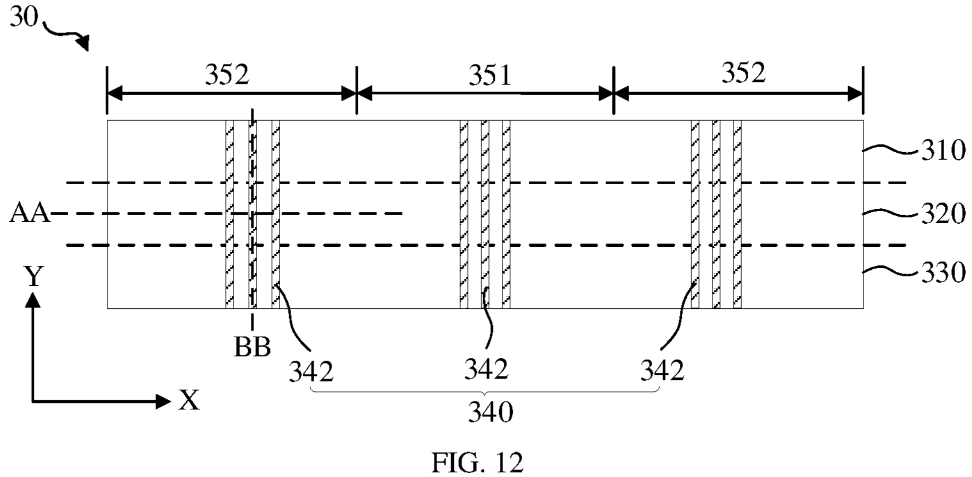
FIG. 12 is a third expansion diagram of a protective layer in a display module according to the present disclosure.
Figure 13:
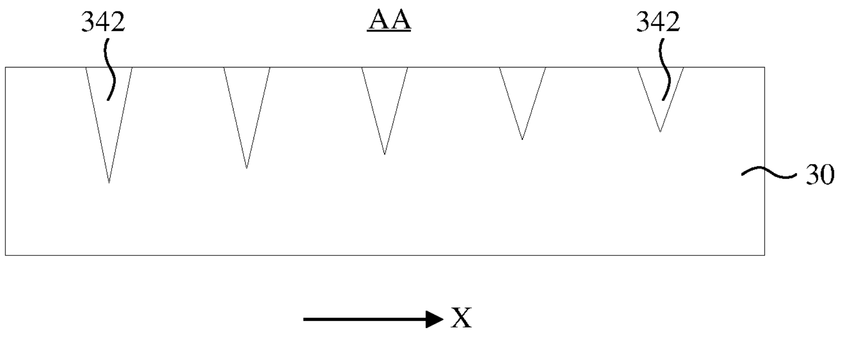
FIG. 13 is a first sectional view of a cross section AA in FIG. 11 or FIG. 12.

Referring to FIG. 12, the plurality of grooves 340 may include first grooves 341 and second grooves 342. The first grooves 341 may be located in a region of the protective layer 30 corresponding to the first bent section 211. The second grooves 342 may be located in regions of the protective layer 30 corresponding to the second bent sections 212. In other words, the first grooves 341 are located in the first protective region 351 and the second grooves 342 are located in the second protective regions 352.

In the present embodiment, a structure shown in FIG. 12 is a combination of the structures of FIG. 10 and FIG. 11, that is, the first grooves 341 are provided in combination with the second grooves 342. In this way, the protective layer 30 may be divided into several sections, and an arc length and an arc height of each section of the protective layer 30 are reduced, to enable each section of the protective layer 30 to curve more easily, avoiding a problem of the abnormal curving occurring in the curved part 130 at a position corresponding to the second bent sections 212.

In the present embodiment, due to the combination of the first grooves 341 and the second grooves 342, the second grooves 342 may reduce bending stiffness of these regions, to enable the regions in which the second grooves 342 are located to curve more easily. Therefore, the extending length of the first grooves 341 in the second direction Y may equal or not equal to a length of the protective layer 30 in the second direction Y.

In the present embodiment, there may be a plurality of first grooves 341 and second grooves 342. The plurality of first grooves 341 may be arranged at intervals. The plurality of second grooves 342 may be arranged at intervals.

In the present embodiment, depths of the grooves 340 close to the first bent section 211 are less than depths of the grooves 340 away from the first bent section 211. For details, referring to FIG. 13, it is a first sectional view of a cross section AA in FIG. 11 or FIG. 12. The second grooves 342 are used as an example for description. In the structure shown in FIG. 11, depths of the second grooves 342 close to the first bent section 211 are less than depths of the second grooves 342 away from the first bent section 211.

In the present embodiment, depths of the plurality of grooves 340 may gradually decrease in a direction from the second bent sections 212 to the first bent section 211. In the structure shown in FIG. 11, depths of the second grooves 342 may gradually decrease. In other words, the depths of the second grooves 342 may be negatively correlated with the curvature radius of the cover plate 20 in the present embodiment.

In the present embodiment, deeper depths of grooves 340 indicate fewer materials of the protective layer 30 in corresponding regions and lower bending stiffness of the regions, to enable the protective layer 30 to curve more easily, thereby facilitating rounding of an arc angle of the curved part 130, mitigating an abnormal shape of a side of the curved part 130 close to the cover plate 20, improving force uniformity of the curved part 130, and reducing a risk of line rupture in the display panel 10.

Figure 14:
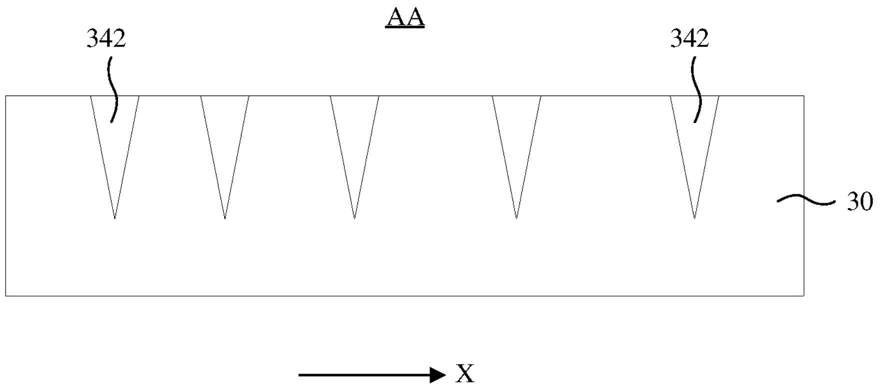
FIG. 14 is a second sectional view of a cross section AA in FIG. 11 or FIG. 12.

Referring to FIG. 14, it is a second sectional view of a cross section AA in FIG. 11 or FIG. 12. Depths of the plurality of grooves 340 are same, and a spacing between two adjacent grooves 340 corresponding to the first bent section 211 is greater than a spacing between two adjacent grooves 340 corresponding to the second bent sections 212.

For example, in a structure shown in FIG. 14, the second grooves 342 are used as an example. Depth of each second groove 342 may be same. A shorter spacing between two adjacent second grooves 342 indicates a more quantity of the second grooves 342 provided in a unit spacing in the regions, fewer materials used in the protective layer 30 in the regions, and lower bending stiffness of the regions, to enable the protective layer 30 to curve more easily. Therefore, in a region with a short curvature radius of the cover plate 20, stronger bending force applied by the cover plate 20 on the curved part 130 enables the abnormal curving to occur more easily. In addition, a more quantity of the second grooves 342 in the region indicates lower bending stiffness of the protective layer 30 in the region, to enable the protective layer 30 to curve more easily and offset the abnormal curving caused by increased bending curvature, thereby facilitating rounding of an arc angle of the curved part 130, and mitigating an abnormal shape of a side of the curved part 130 close to the cover plate 20.

In the present embodiment, the spacing between two adjacent grooves 340 gradually increases in a direction from the second bent sections 212 to the first bent section 211. In other words, the spacing between two adjacent grooves 340 may be positively correlated with the curvature radius of the cover plate 20 in the present embodiment.

In conventional technologies, the abnormal curving of the display panel 10 is mainly concentrated in a region close to the first body 110. In other words, curving of the cover plate 20 causes curving stress of the display panel 10 to be mainly concentrated in the region of the protective layer 30 close to the first body 110. To mitigate a problem in which the curving stress is concentrated in the region, the material of the protective layer 30 in the first protective part 310 is reduced, to lower bending stiffness of the region, to mitigate a problem of the abnormal curving in the present disclosure.

Figure 15:
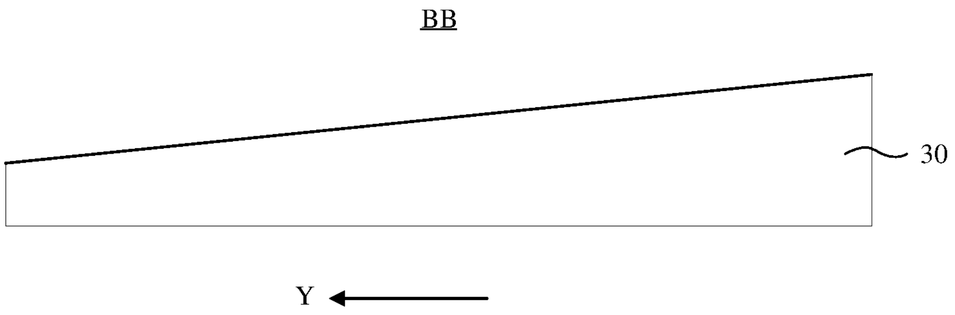
FIG. 15 is a sectional view of a cross section BB in FIG. 11 or FIG. 12.

Referring to FIG. 15, it is a sectional view of a cross section BB in FIG. 11 or FIG. 12. A depth of a side of each groove 340 close to the first body 110 is greater than that of a side of each groove 340 away from the first body 110. In the present embodiment, the second grooves 342 are used as an example. Deeper depth of a side of each second groove 342 close to the first body 110 indicated fewer material of a side of the protective layer 30 close to the first body 110 and lower bending stiffness of the side of the protective layer 30 close to the first body 110, to enable the protective layer 30 to curve more easily. Shallower depth of a side of each second groove 342 away from the first body 110 indicates more remaining materials of a side of the protective layer 30 away from the first body 110 and higher bending stiffness of the region, to improve support force applied by the protective layer 30 in the region on the curved part 130. Therefore, in the present disclosure, the depth of the side of the grooves 340 close to the first body 110 is greater than that of the side of the grooves 340 away from the first body 110, to reduce the bending stiffness of the side of the protective layer 30 close to the first body 110, mitigate a problem in which curving stress is concentrated on the side of the protective layer close to the first body, thereby facilitating rounding of an arc angle of the curved part 130, mitigating an abnormal shape of a side of the curved part 130 close to the cover plate 20, improving force uniformity of the curved part 130, and reducing a risk of line rupture in the display panel 10.

Figure 16:
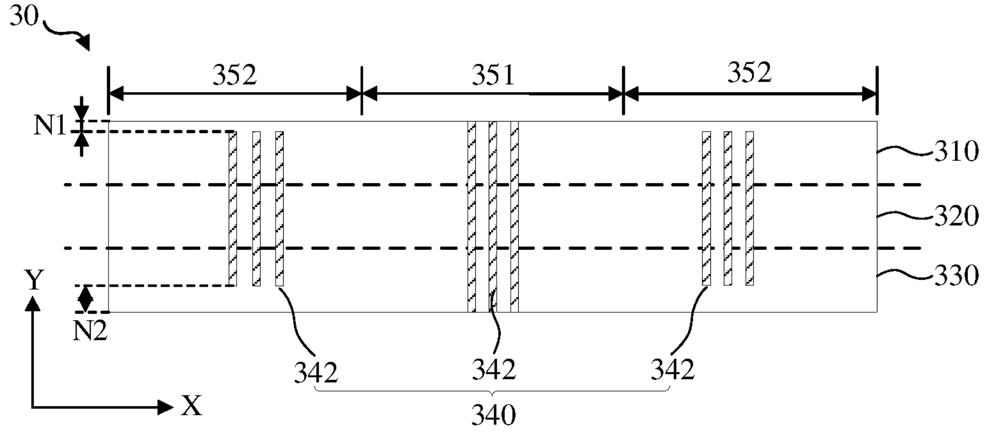
FIG. 16 is a fourth expansion diagram of a protective layer in a display module according to the present disclosure.
Figure 17:
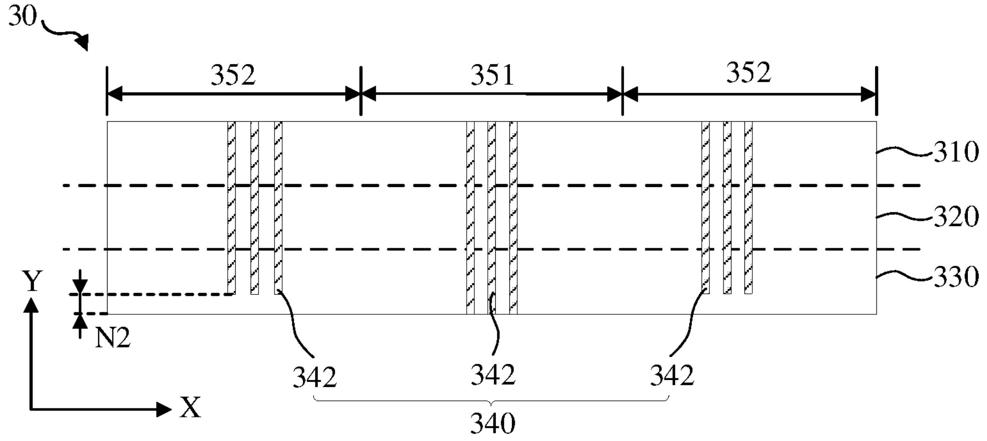
FIG. 17 is a fifth expansion diagram of a protective layer in a display module according to the present disclosure.
Figure 18:
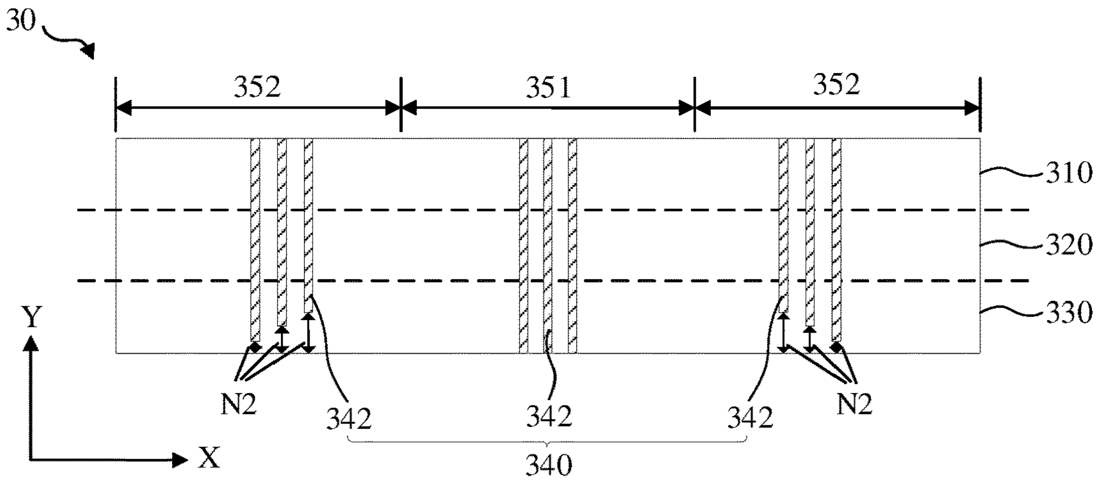
FIG. 18 is a sixth expansion diagram of a protective layer in a display module according to the present disclosure.

FIGS. 16 to 18 show that an orthographic projection of the plurality of grooves 340 on the protective layer 30 overlaps at least the curved protective part 320 and a part of the first protective part 310. The second grooves 342 are used as an example. It is no need for the second grooves 342 to run through the entire protective layer 30 in an extending direction of the second grooves 342. For example, in structures of FIG. 16 and FIG. 17, the second grooves 342 overlap the first protective part 310 and the curved protective part 320. The second grooves 342 in FIG. 16 do not completely run through the first protective part 310. The second grooves 342 in FIG. 17 completely run through the first protective part 310. For example, in a structure in FIG. 18, the second grooves 342 overlap the first protective part 310, the curved protective part 320, and the second protective part 330. However, an overlapping area of the second grooves 342 and the first protective part 310 is larger than an overlapping area of the second grooves 342 and the second protective part 330.

In structures in FIGS. 16 to 18, a spacing between an end of each second groove 342 close to the first body 110 and an end of the protective layer 30 close to the first body 110 in the second direction Y is a first spacing N1. A spacing between an end of each second groove 342 close to the second body 120 and an end of the protective layer 30 close to the second body 120 in the second direction Y is a second spacing N2. The first spacing N1 is less than the second spacing N2. The first spacing N1 in FIG. 17 is 0.

In the structures in FIGS. 16 to 18, although a material of the protective layer 30 in the first protective part 310 and the second protective part 330 are reduced, a material of the protective layer 30 removed from the first protective part 310 is more than a material of the protective layer 30 removed from the second protective part 330. In other words, bending stiffness of the first protective part 310 is lower than bending stiffness of the second protective part 330. The first protective part 310 is more easily to curve in comparison with the second protective part 330, thereby facilitating rounding of an arc angle of the curved part 130, mitigating an abnormal shape of a side of the curved part 130 close to the cover plate 20, improving force uniformity of the curved part 130, and reducing a risk of line rupture in the display panel 10.

In the structure in FIG. 18, for the plurality of grooves 340 corresponding to the second bent sections 212, the second spacing of the grooves 340 close to the first bent section 211 is less than the second spacing of the grooves 340 away from the first bent section 211. The second grooves 342 are used as an example. The second spacing of the second grooves 342 close to the first protective region 351 is less than that of the second grooves 342 away from the first protective region 351.

In addition, the second spacing N2 may gradually increase in the direction from the second bent sections 212 to the first bent section 211. In other words, the second spacing N2 of second grooves 342 may be positively correlated with the curvature radius of the cover plate 20.

In the present embodiment, in FIGS. 13 to 18, the first grooves 341 and the second grooves 342 may be of a same feature.

In the foregoing embodiments, the depths of the grooves 340 may less than the thickness of the protective layer 30. For example, a cross section of each groove 340 is V-shaped, and an acute angle a between a surface of each groove 340 and the light-exiting surface of the display module ranges from 35° to 75°.

Figure 19:
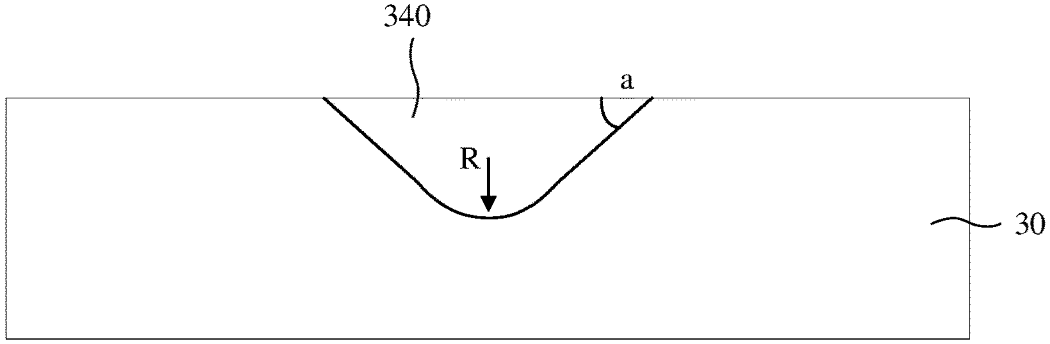
FIG. 19 is a diagram of a first structure of a groove on a protective layer in a display module according to the present disclosure.

In a structure in FIG. 19, the protective layer 30 may be grooved by using a carbon dioxide laser. The grooves 340 having large-angles may be formed. A bottom of each groove 340 is of a circular arc shape. For example, when the thickness of the protective layer 30 is 96.9 μm, the depths of grooves 340 may be 46 μm, an arc radius R at the bottom of each groove 340 may be 24.9 μm, and the acute angle a between the surface of each groove 340 and the light-exiting surface of the display module may be 38.8°.

Figure 20:
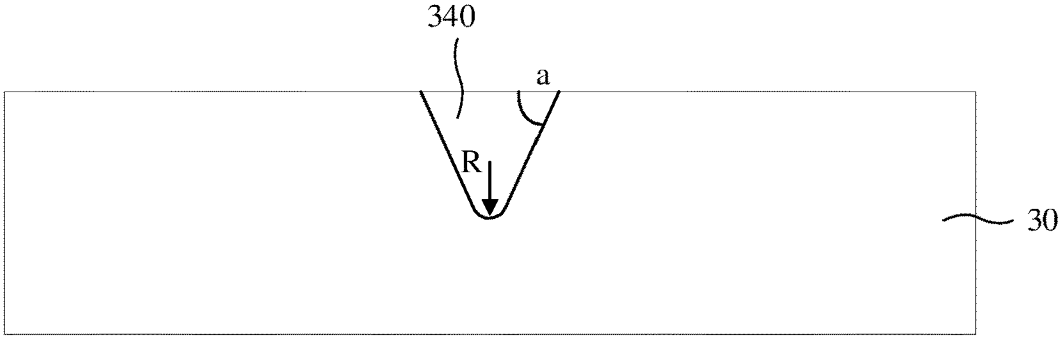
FIG. 20 is a diagram of a second structure of a groove on a protective layer in a display module according to the present disclosure.

In a structure in FIG. 20, the protective layer 30 may be grooved by using an ultraviolet laser. The grooves 340 having small-angles may be formed. A bottom of each groove 340 is of a circular arc shape. For example, when the thickness of the protective layer 30 is 102.6 μm, the depths of grooves 340 may be 55.7 μm, an arc radius R at the bottom of each groove 340 may be 10 μm, and the acute angle a between the surface of each groove 340 and the light-exiting surface of the display module may be 69.2°.

The arc radius at the bottom of each groove 340 in FIG. 19 is larger than the arc radius at the bottom of each groove 340 in FIG. 20. The bottom of each groove 340 in FIG. 20 is sharp, which may cause a problem that force concentration occurs easily, while the bottom of each groove 340 in FIG. 19 is rounded and a force is more uniform.

The present disclosure further provides a mobile terminal. The mobile terminal includes a terminal body and the foregoing display module. The terminal body and the display module are integrated. The terminal body may be a circuit board or other elements bound to the display panel, a cover plate covering the display panel, and the like. The mobile terminal may include an electronic device, such as a mobile phone, a television, and a notebook computer.

The present disclosure discloses a display module and a mobile terminal. The display module includes a display panel, a cover plate, and a protective layer disposed on a surface of the display panel. The display panel includes a first body, a curved part, and a second body. The protective layer includes a first protective part, a second protective part, and a curved protective part that are continuously arranged. The first protective part covers a part of the first body. The second protective part covers a part of the second body. The curved protective part covers the curved part. Bending stiffness of the curved protective part close to the first protective part is lower than bending stiffness of the curved protective part close to the second protective part. In the present disclosure, the bending stiffness of the curved protective part close to the first protective part is reduced to enable the curved part in a region to curve more easily, and the bending stiffness of the curved protective part close to the second protective part is increased to improve support force on the curved part in a region close to the second protective part, thereby facilitating rounding of an arc angle of the curved part, mitigating an abnormal shape of a side of the curved part close to the cover plate, improving force uniformity of the curved part, and reducing a risk of line rupture in the display panel.

In the foregoing embodiments, the descriptions of the embodiments have different focuses. For a part that is not detailed in an embodiment, reference may be made to the relevant description of other embodiments.

The display module and the mobile terminal provided in embodiments of the present disclosure are described above in detail. Although the principles and implementations of the present disclosure are described by using specific examples in this specification, the descriptions of the foregoing embodiments are merely intended to help understand the technical solutions and the core idea of the present disclosure. A person of ordinary skill in the art should understand that: modifications may still be made to the technical solutions described in the above embodiments, or equivalent replacements may be made to some technical features; and these modifications or replacements will not cause the essence of corresponding technical solutions to depart from the scope of the technical solutions in the embodiments of the present disclosure.

What is claimed is:

1. A display module, comprising:

a display panel comprising a first body, a second body, and a curved part disposed between the first body and the second body, wherein the second body is disposed on a side facing away from a light-exiting surface of the display panel;

a cover plate disposed on the display panel, wherein the cover plate comprises a first bent part corresponding to the curved part, the first bent part comprises a first bent section and second bent sections located on both sides of the first bent section, a minimum value of bending curvature of the first bent section is less than or equal to a maximum value of bending curvature of the second bent sections, and the bending curvature of the second bent sections is greater than 0; and a protective layer disposed on a surface of the display panel, wherein the protective layer covers the curved part, a part of the first body, and a part of the second body, wherein the protective layer is provided with a plurality of grooves, the plurality of grooves are arranged at intervals along a first direction and extend along a second direction, the first direction is parallel to a direction from the first bent section to the second bent sections, and the second direction is parallel to a curve direction from the first body to the second body.

2. The display module as claimed in claim 1, wherein the plurality of grooves are located in a region of the protective layer corresponding to the first bent section, and extending lengths of the grooves in the second direction are equal to a length of the protective layer in the second direction.

3. The display module as claimed in claim 1, wherein the plurality of grooves are located in regions of the protective layer corresponding to the second bent sections.

4. The display module as claimed in claim 1, wherein the plurality of grooves are located in regions of the protective layer corresponding to the first bent section and the second bent sections.

5. The display module as claimed in claim 3, wherein depths of the grooves close to the first bent section are less than depths of the grooves away from the first bent section.

6. The display module as claimed in claim 5, wherein depths of the plurality of grooves gradually decrease in a direction from the second bent sections to the first bent section.

7. The display module as claimed in claim 3, wherein a depth of a side of each groove close to the first body is greater than a depth of a side of each groove away from the first body.

8. The display module as claimed in claim 3, wherein depths of the plurality of grooves are same, and a spacing between two adjacent grooves corresponding to the first bent section is greater than a spacing between two adjacent grooves corresponding to the second bent sections.

9. The display module as claimed in claim 8, wherein the spacing between two adjacent grooves gradually increases in a direction from the second bent sections to the first bent section.

10. The display module as claimed in claim 3, wherein the protective layer comprises a first protective part, a curved protective part, and a second protective part that are continuously arranged, the first protective part covers the part of the first body, the second protective part covers the part of the second body, and the curved protective part covers the curved part; and an orthographic projection of the plurality of grooves on the protective layer overlaps at least the curved protective part and a part of the first protective part.

11. The display module as claimed in claim 10, wherein a spacing between an end of each groove close to the first body and an end of the protective layer close to the first body in the second direction is a first spacing, a spacing between an end of each groove close to the second body and an end of the protective layer close to the second body in the second direction is a second spacing, and the first spacing is less than the second spacing.

12. The display module as claimed in claim 10, wherein in the plurality of grooves corresponding to the second bent sections, the second spacing of the grooves close to the first bent section is less than the second spacing of the grooves away from the first bent section.

13. The display module as claimed in claim 1, wherein depths of the grooves are less than a thickness of the protective layer, and a cross section of each groove is V-shaped, and an acute angle between a surface of each groove and the light-exiting surface of the display module ranges from 35° to 75°.

14. The display module as claimed in claim 1, wherein bending curvature of the cover plate gradually decreases in the direction from the first bent section to the second bent sections.

15. The display module as claimed in claim 1, wherein the cover plate comprises a first section and a second section that are arranged continuously in the direction from the first bent section to the second bent sections, bending curvature of the first section is a constant value, and bending curvature of the second section gradually decreases.

* * * * *